United States Patent
Yano et al.

[11] Patent Number: 6,166,386
[45] Date of Patent: Dec. 26, 2000

[54] MICRO-PROCESSING METHOD USING A PROBE

[75] Inventors: Koji Yano, Zama; Ryo Kuroda, Kawasaki, both of Japan

[73] Assignee: Canon Kabushiki Kaisha, Tokyo, Japan

[21] Appl. No.: 09/088,758

[22] Filed: Jun. 2, 1998

[30] Foreign Application Priority Data

Jun. 2, 1997 [JP] Japan ................................. 9-159144
Jun. 2, 1997 [JP] Japan ................................. 9-159217

[51] Int. Cl.[7] .......................... H01L 21/00; H01J 37/317
[52] U.S. Cl. ............................... 250/492.2; 430/296
[58] Field of Search ..................... 250/492.2; 430/296; 438/949, 951

[56] References Cited

U.S. PATENT DOCUMENTS

| | | | |
|---|---|---|---|
| 5,049,461 | 9/1991 | Arnett et al. | 250/492.1 |
| 5,336,892 | 8/1994 | Dobisz et al. | 250/492.2 |
| 6,020,215 | 2/2000 | Yagi et al. | 438/52 |

FOREIGN PATENT DOCUMENTS 63-161552  7/1988  Japan .
63-161553  7/1988  Japan .

OTHER PUBLICATIONS

G. Binning, et al., "Surface Studies by Scanning Tunneling Microscopy", Physical Review Letters, 1982, vol. 49, pp. 57–61.

*Primary Examiner*—Jack Berman
*Attorney, Agent, or Firm*—Fitzpatrick, Cella, Harper & Scinto

[57] ABSTRACT

A micro-processing method is provided for forming a structure adapted to confine electrons within a micro-region. The method comprises steps of arranging a probe oppositely relative to a non-electroconductive thin film arranged on an electroconductive substrate, placing the probe on or near the surface to be processed of the non-electroconductive thin film, applying a voltage between the probe and the substrate to form an enhanced electroconductivity region as compared with the remaining area in the non-electroconductive thin film, and oxidizing the interface of the substrate and the non-electroconductive thin film.

14 Claims, 10 Drawing Sheets

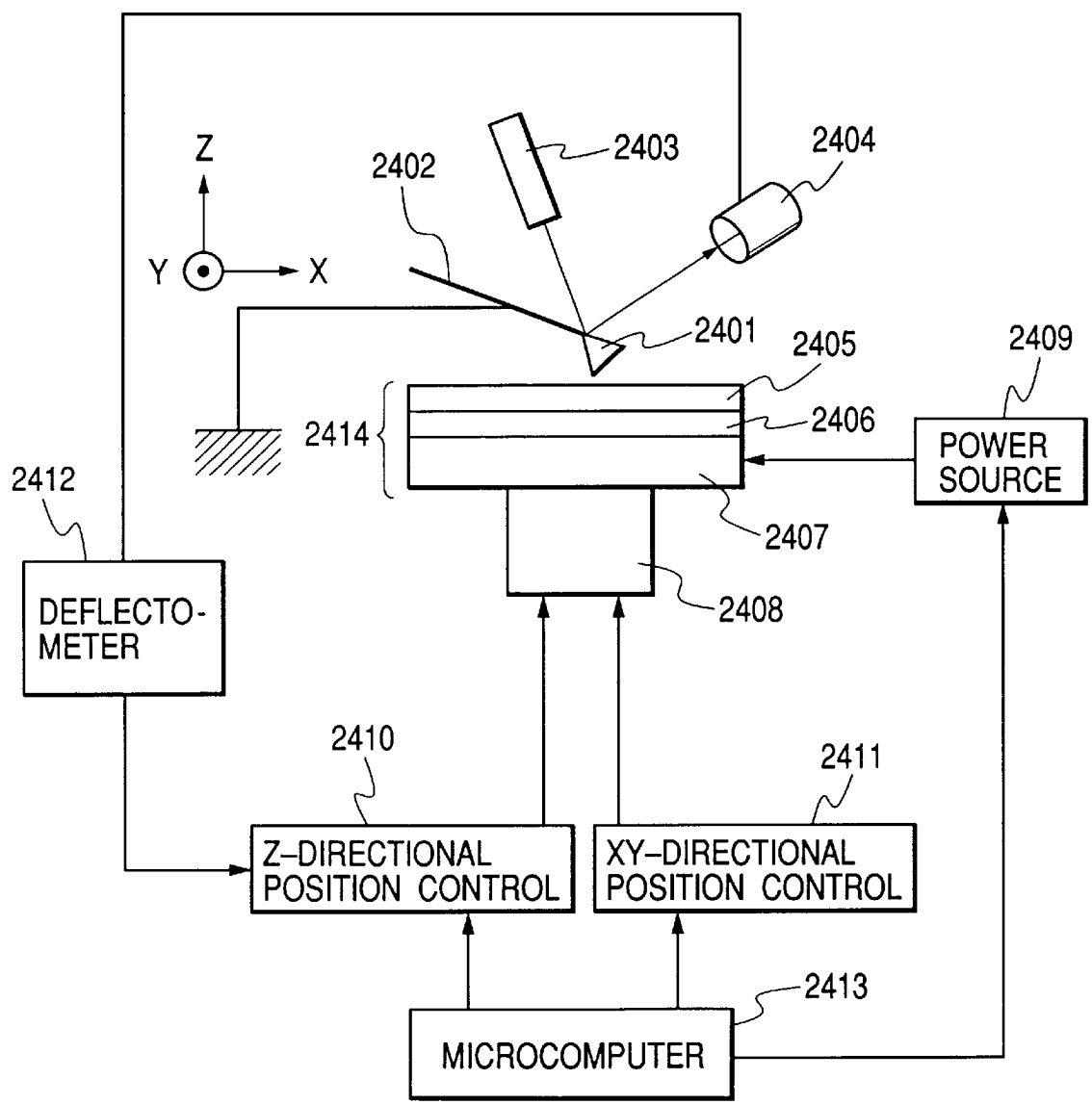

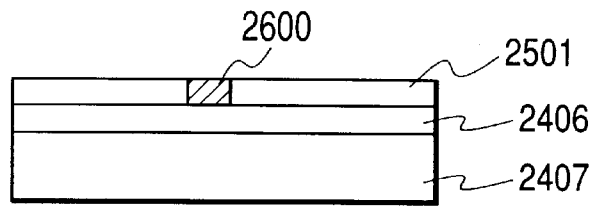
FIG. 10A
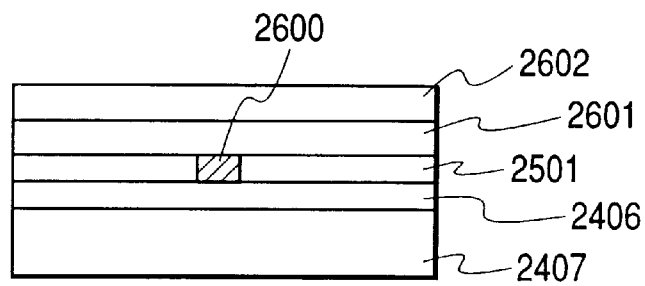
FIG. 10B
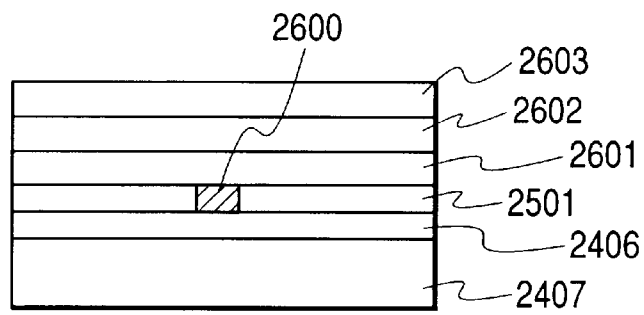
FIG. 10C
FIG. 10D
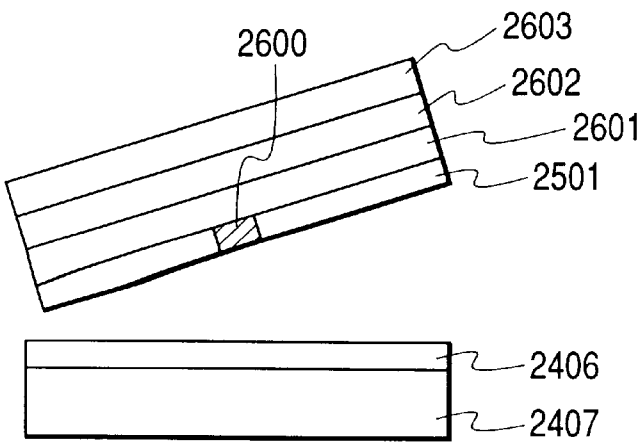

MICRO-PROCESSING METHOD USING A PROBE

BACKGROUND OF THE INVENTION

1. Field of the Invention

This invention relates to a micro-processing method of forming a structure adapted to confine electrons within a micro-region and, more particularly, it relates to a micro-processing method to be used for processing applications of the above described type that use a scanning probe microscope.

2. Related Background Art

The recent development of scanning tunneling microscopes (hereinafter referred to as STM) [G. Binnig et al., Phys. Rev. Lett., 49, 57 (1982)] allows a direct observation of a real spatial image of a specimen on an atomic or molecular level.

A scanning tunneling microscope is designed to scan an electroconductive specimen by means of a probe electrode, controlling the distance between the probe electrode and the electroconductive specimen to maintain the tunneling current flowing therebetween so that the electron cloud of the surface of the specimen and the profile of the specimen may be observed on the order of sub-nanometers on the basis of the data on the control signal used for controlling the distance.

Meanwhile, the atomic force microscope (hereinafter referred to as the AFM) has been developed as means for observing the surface of a specimen also on the order of sub-nanometers.

With an AFM, the surface profile of a specimen can be observed on the order of sub-nanometers even if the specimen is not electroconductive. The technique of obtaining physical information of the surface of a specimen on the basis of the interaction between a probe and the surface of a specimen by two-dimensionally scanning the surface by means of the probe of an STM or an AFM is generally referred to as scanning probe microscopy (SPM), which has been attracting attention as means of observing the surface of a specimen with an enhanced level of resolution.

Now, formation of micro-structures on the order of the size of an atom is fully possible by utilizing the principle of SPM.

For instance, Japanese Patent Application Laid-Open Nos. 63-161552 and 63-161553 disclose a technology for applying a voltage to an insulation film utilizing the principle of STM and produce a change in the electroconductivity of the insulation film. With the disclosed technology, it is possible to produce in an object of micro-processing an area showing an enhanced level of electroconductivity which is as small as several nanometers.

Generally, a component element of an electronic device showing quantum effects can be formed by confining electrons within a very small region of a sub-micron size.

For instance, a structure referred to as quantum dot and showing an electron-confining effect can be obtained by forming a spherical or cubic electroconductive region of a size between several nanometers to several hundred nanometers and enclosing it within a non-electroconductive region.

Similarly, a structure referred to as quantum wire and showing an electron-confining effect can be obtained by forming a rod-shaped electroconductive region of a size between several nanometers to several hundred nanometers in diameter and enclosing it within a non-electroconductive region.

Thus, a structure of confining electrons within a very small region takes a vital role in realizing a device showing quantum effects.

However, it is difficult with a technology disclosed in either of Japanese Patent Application Laid-Open Nos. 63-161552 and 63-161553 to confine electrons within a very small region because an area with an enhanced level of electroconductivity realized by means of such a technology is electrically connected to a substrate electrode.

SUMMARY OF THE INVENTION

It is therefore an object of the present invention to provide a micro-processing method of forming a structure adapted to confine electrons within a micro-region by solving the above identified problem.

According to an aspect of the invention, the above object is achieved by providing a micro-processing method of forming a structure adapted to confine electrons within a micro-region, said method comprising steps of:

arranging a probe oppositely relative to a non-electroconductive thin film arranged on an electroconductive substrate;

placing said probe on or near the surface to be processed of said non-electroconductive thin film;

applying a voltage between said probe and said substrate to form an enhanced electroconductivity region as compared with the remaining area in said non-electroconductive thin film; and oxidizing the interface of said substrate and said non-electroconductive thin film.

According to another aspect of the invention, there is also provided a micro-processing method of forming a structure adapted to confine electrons within a micro-region, said method comprising steps of:

arranging a probe oppositely relative to a non-electroconductive thin film arranged on an electroconductive substrate;

placing said probe on or near the surface to be processed of said non-electroconductive thin film;

applying a voltage between said probe and said substrate to form an enhanced electroconductivity region as compared with the remaining area in said non-electroconductive thin film; and causing at least part of said enhanced electroconductivity region to contact with a non-electroconductive area constituting at least part of another substrate and transferring said non-electroconductive thin film onto said another substrate.

BRIEF DESCRIPTION OF THE DRAWINGS

FIG. 8 is a schematic block diagram of another apparatus that can be used with the second mode of carrying out a micro-processing method as illustrated in FIGS. 5A through 5D.

FIGS. 10A, 10B, 10C and 10D are schematic cross sectional lateral views of the system of FIGS. 5A through 5D, showing another specific peeling technique in different steps.

DESCRIPTION OF THE PREFERRED EMBODIMENTS

First Mode of Carrying out the Invention

Now, a first mode of carrying out a micro-processing method according to the present invention will be described by referring to FIGS. 1A through 1C.

Figure 1A:
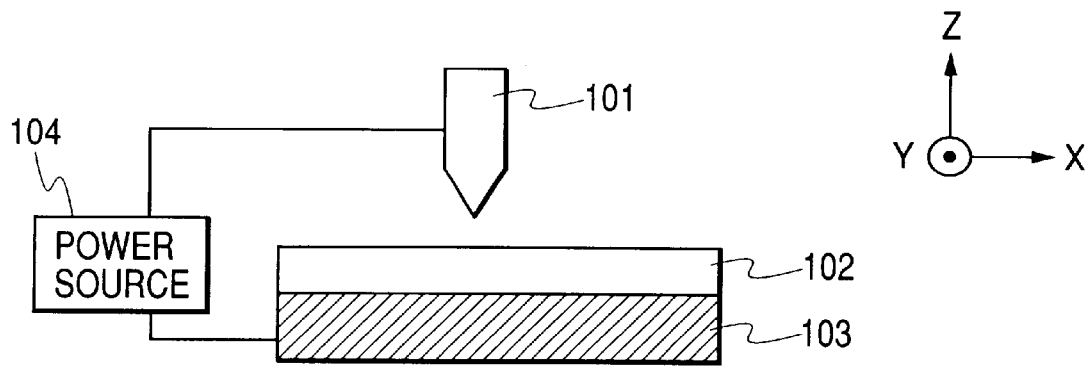
FIGS. 1A, 1B and 1C are schematic cross sectional lateral views of a system to be used for a first mode of carrying out a micro-processing method according to the invention shown in different processing steps.
Figure 1B:
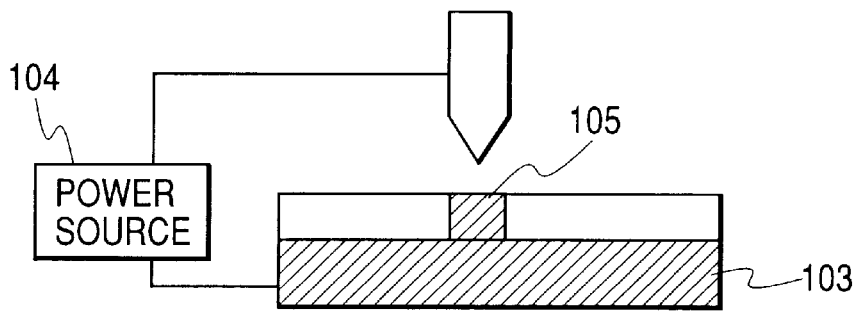

First, the tip of probe 101 is placed on or near the surface to be processed of non-electroconductive thin film 102 (FIG. 1A). Note that the term "non-electroconductive" as used herein refers to the property of presenting an energy barrier relative to the enhanced electroconductivity region produced by the voltage application. The expression "near the surface" as used herein refers to a position where the voltage applied between the probe and the non-electroconductive thin film can affect the latter. This means that the voltage applied to the non-electroconductive thin film can modify the electroconductivity of the non-electroconductive thin film or the applied voltage gives rise to an electric current that can modify the electroconductivity of the non-electroconductive thin film.

Then, a voltage is applied between the probe 101 and the electroconductive substrate 103 by means of an external power source 104. As a result of the voltage application, a voltage is applied to the non-electroconductive thin film in a direction perpendicular relative to the substrate to raise the electroconductivity of the non-electroconductive thin film (FIG. 1B). It may be appreciated that, for the purpose of the invention, a non-electroconductive thin film whose electroconductivity is raised when a voltage is applied thereto will be used. Specific examples of materials that can be used for a non-electroconductive thin film for the purpose of the invention include polyimide, lead phthalocyanine and the like. The area of the non-electroconductive thin film where the electroconductivity is raised will be referred to as "enhanced electroconductivity region" hereinafter. Under this condition, the enhanced electroconductivity region 105 is electrically connected to the electroconductive substrate 103.

While the electroconductive substrate 103 may carry a thin oxide film on the surface before the voltage application by the power source 104, the oxide film, if any, should be sufficiently thin so that the applied voltage can effectively affect the non-electroconductive thin film 102. Note that the oxide film, if any, existing in the initial stages does not electrically insulate the enhanced electroconductivity region 105 from the electroconductive substrate 103.

Figure 1C:
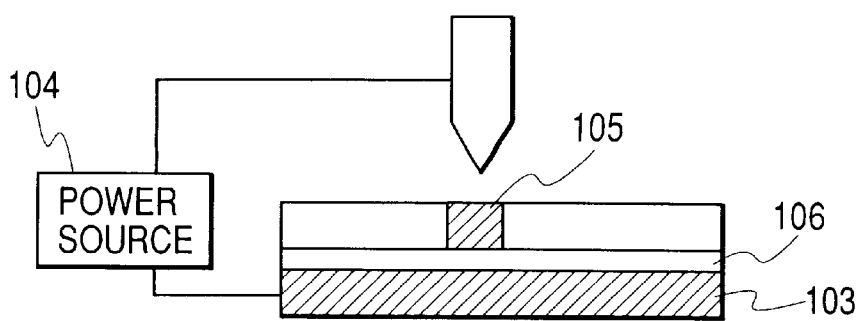

Thereafter, the electroconductive substrate 103 is oxidized on the surface under this condition to produce an oxide film 106 (FIG. 1C). Since the oxide film 106 is generally an insulating material, the enhanced electroconductivity region 105 and the electroconductive substrate 103 will be electrically insulated by the oxide film 106.

Methods that can be used for the oxidation include thermal oxidation, natural oxidation and anodic oxidation.

In the case of thermal oxidation, the electroconductive substrate 103 is heated in an oxygen-containing atmosphere. Since the probe 101 and the power source 104 have nothing to do with the oxidation process, only the non-electroconductive thin film 102 including the enhanced electroconductivity region 105 and the electroconductive substrate 103 may be taken out and heated separately from the other system parts. Note that a thermal oxidation process can reduce the time necessary for carrying out the process if compared with a natural oxidation process.

In the case of natural oxidation, the electroconductive substrate 103 is oxidized at room temperature in an oxygen-containing atmosphere. Again, since the probe 101 and the power source 104 have nothing to do with the oxidation process, only the non-electroconductive thin film 102 including the enhanced electroconductivity region 105 and the electroconductive substrate 103 may be taken out and heated separately. While a natural oxidation process may take a long time to complete, it provides an advantage of being free from damage due to heat on the part of the final product.

The probe 101 is used for anodic oxidation. In an anodic oxidation process, a voltage is applied from the power source 104 such that the probe 101 shows negativity while the electroconductive substrate 103 shows positivity to give rise to anodic oxidation on the electroconductive substrate 103.

The area to be oxidized can be controlled by controlling the position of the probe 101. Generally, anodic oxidation is realized only under and near the enhanced electroconductivity region 105. With this technique, a same apparatus can be used to apply a voltage in order to raise the electroconductivity of the non-electroconductive thin film and also to raise the electric potential of the surface of the electroconductive substrate.

Additionally, since the operation of raising the electroconductivity of the non-electroconductive thin film 102 is conducted in a non-oxygen atmosphere, the electroconductive substrate 103 is protected against unnecessary and undesired oxidation that can occur while a voltage is being applied thereto.

As a matter of definition, a non-oxygen atmosphere refers to an atmosphere that contains no oxygen that can be a nitrogen atmosphere, an argon atmosphere or vacuum. While any non-electroconductive thin film may be used for this process so long as its electroconductivity is raised by applying a voltage thereto, the use of polyimide is preferable because it shows a high mechanical strength and can remain mechanically undamaged if the probe collides with the non-electroconductive thin film for some reason or other.

Note that the use of a non-electroconductive thin film prepared by means of a Langmuir-Blodgett's technique is particularly advantageous because it has a very flat surface and hence can minimize the risk of the probe colliding with the surface of the film and the positional dependency of the voltage application.

A probe that can be used for SPM can also be used for the purpose of the invention so long as it is electroconductive.

A probe that can be used for the purpose of the invention can also be operated for SPM. For example, by applying a voltage between such a probe and an electroconductive substrate to such an extent that it does not raise the electroconductivity of a non-electroconductive thin film disposed therebetween and by controlling the probe to move in the Z-direction as shown in FIG. 1A so that the electric current flowing there may be held to a constant level, while driving the probe to scan in the X- and Y-directions in FIG. 1A, data on the surface of the non-electroconductive thin film 102 can be obtained from the control signal for controlling the probe in the Z-direction. This is exactly the theory for observing the surface of a micro-object by means of an STM.

If the probe is supported by a resilient member in such a way that the tip of the probe is just in contact with the surface of the non-electroconductive thin film and a voltage is applied thereto under this condition, then an accident where the probe digs into the non-electroconductive thin film to damage the latter can be effectively avoided.

For the purpose of the invention, the resilient member may be a leaf spring of the type typically used as a cantilever in an ordinary AFM.

The use of a resilient member is advantageous in that, if the resilient member is moved to make the tip of the probe to be pressed against the surface of the non-electroconductive thin film from the state where the tip is just in contact with the surface of the thin film, the resilient member can effectively absorb the pressure or the flexure.

The probe can be used for an ordinary AFM which is provided with an arrangement for detecting the flexure of the probe. Thus, by designing the probe to operate as that of an ordinary AFM, the surface of the non-electroconductive thin film can be observed without applying a voltage thereto prior to the operation of raising the electroconductivity of the thin film by applying a voltage thereto. Then, the non-electroconductive thin film can be held free from any unnecessary and undesired voltage application.

Now, the first mode of carrying out the present invention will be described by way of examples.

EXAMPLE 1

Figure 2:
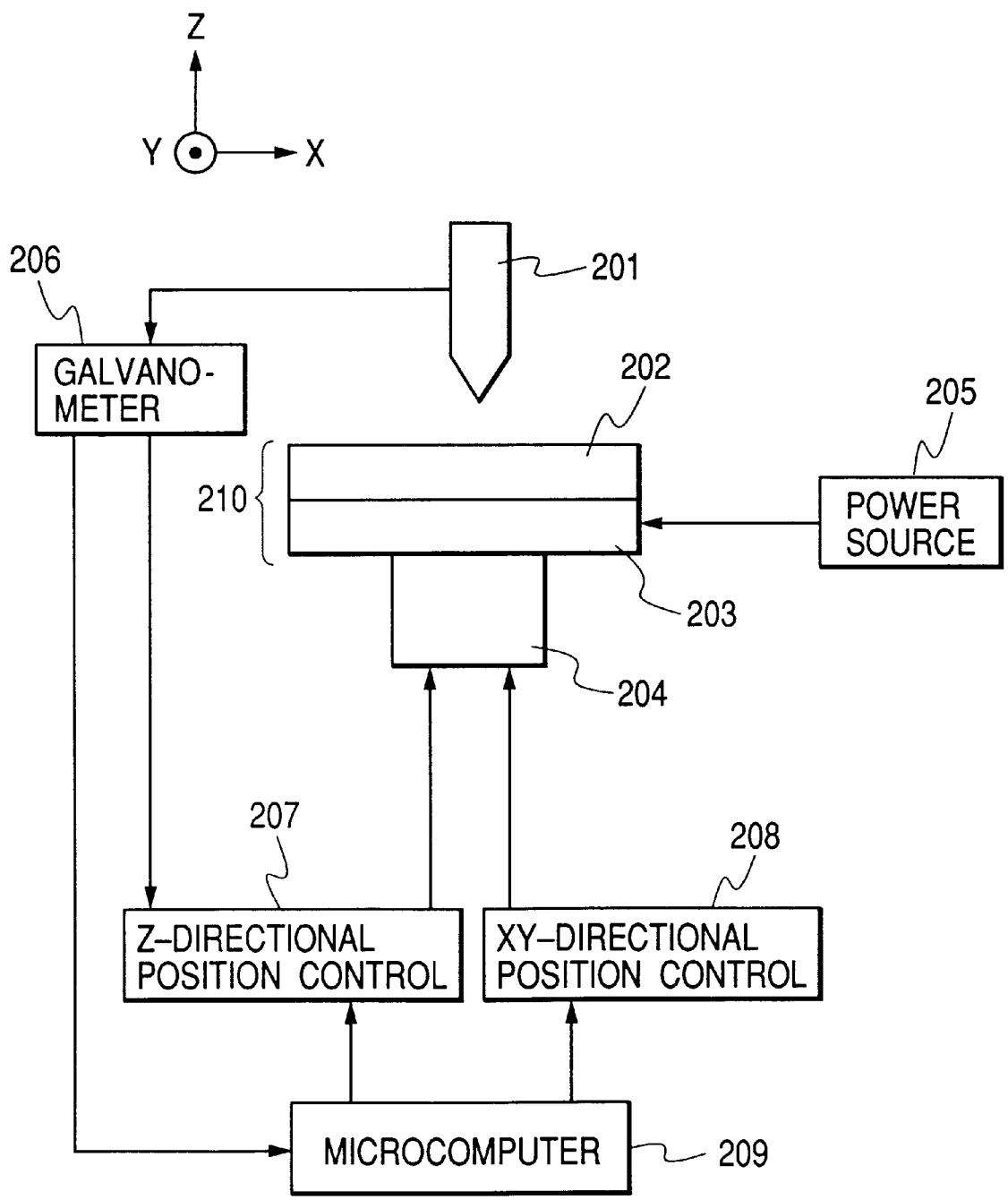
FIG. 2 is a schematic block diagram of an apparatus that can be used with the first mode of carrying out a micro-processing method as illustrated in FIGS. 1A through 1C.

Example 1 will be described by referring to FIG. 2 showing an micro-processing apparatus that can be used with a micro-processing method according to the invention. The shown micro-processing apparatus comprises the following components:

201: a probe,
204: a piezoelectric element,
205: a power source,
206: a current detection circuit or galvanometer),
207: a Z-directional position control circuit,
208: an XY-directional position control circuit and
209: a microcomputer.

On the other hand, the specimen to be processed comprises:

202: a $GeSb_2Te_4$ thin film and
203: an Si substrate.

For the purpose of the invention, a specimen to be processed 210 refers to the combination of a $GeSb_2Te_4$ thin film 202 and an Si substrate 203.

The probe 201 is made of Pt and available as component of an ordinary STM. Its tip shows a radius of curvature on the order of 10 nm.

A $GeSb_2Te_4$ thin film 202 to be used for the purpose of the invention is prepared by sputtering and has a film thickness of about 30 nm.

The electroconductivity of a $GeSb_2Te_4$ thin film is raised when a voltage is applied thereto. The Si substrate 203 to be used for the purpose of the invention is an electroconductive Si(100) having a smooth surface. Any oxide film the Si substrate may have on the surface is removed by means of fluoric acid immediately before a $GeSb_2Te_4$ thin film is deposited thereon.

The piezoelectric element 204 is available as component of an ordinary STM and is used to support thereon a specimen to be processed 210.

The specimen can be moved in each of the X-, Y- and Z-directions by externally applying a voltage to the piezoelectric element.

The location of the probe 201 and that of the specimen to be processed 210 relative to each other can be controlled by the piezoelectric element.

The power source 205 is used to apply a voltage between the probe 201 and the Si substrate 203.

The current detector 206 detects the electric current flowing between the probe 201 and the Si substrate 203 and sends a signal representing the detected current to the Z-directional position control circuit 207 and the microcomputer 209.

The Z-directional position control circuit 207 controls the position of the piezoelectric element 204 in the Z-direction by applying a voltage to the piezoelectric element 204 according to the command from the microcomputer 209.

The Z-directional position control circuit 207 can also control the piezoelectric element 204 in the Z-direction so as to make the electric current detected by the current detector 206 equal to the electric current specified by the microcomputer 209.

The XY-directional position control circuit 208 controls the position of the piezoelectric element 204 in the XY-directions by applying a voltage to the piezoelectric element 204 according to the command from the microcomputer 209.

The microcomputer 209 controls the overall operation of micro-processing the specimen 210.

The operation of micro-processing the specimen for this example proceeds in a manner as described below.

Firstly, the XY-directional position control circuit 208 outputs a signal according to the command from the microcomputer 209 in order to drive the piezoelectric element 204 and bring the tip of the probe 201 to the position on the surface of the specimen 210 to be processed.

Then, the microcomputer 209 specifies the distance separating the tip of the probe 201 and the specimen 210 in terms of the electric current that flows therethrough. Subsequently, a voltage is applied from the power source 205 between the probe 201 and the Si substrate 203 and the current detector 206 detects the electric current flowing between the probe 201 and the Si substrate 203 so that the Z-directional position control circuit 207 controls the piezoelectric element 204 to make the detected electric current equal to the above specified value.

Note that the applied voltage is referred to as "the distance controlling voltage". The Z-directional position control circuit 207 stops operating when the electric current gets to the specified value. Then, a voltage for raising the electroconductivity of the $GeSb_2Te_4$ thin film is applied from the power source 205. This voltage is referred to as "the electroconductivity raising voltage".

Generally, a value that does not raise the electroconductivity of the $GeSb_2Te_4$ thin film 202 is selected for the distance controlling voltage and a value that can sufficiently raise the electroconductivity of the $GeSb_2Te_4$ thin film 202 is selected for the electroconductivity raising voltage.

In this example, 0.4V was used for the distance controlling voltage whereas 4.0V was used for the electroconductivity raising voltage.

In this example, an area with a diameter of about 20 nm having an enhanced electroconductivity was formed in the $GeSb_2Te_4$ thin film 202 by applying the above electroconductivity raising voltage. The above described sequence of operation was conducted immediately after taking out the $GeSb_2Te_4$ thin film 202 from the vacuum chamber where the film had been formed by sputtering. While the electric current that was flowing during the voltage application was reduced slightly when the probe 201 was made to show negativity, this may be because of anodic oxidation that occurred as the Si substrate 203 was made to show positivity.

No such reduction in the electric current was observed when the probe was made to show positivity. Thus, the probe 201 is preferably made to show positivity in order to raise the electroconductivity in a stable fashion.

Thereafter, only the processed specimen 210 was taken out and exposed to an atmosphere containing oxygen by 40% and nitrogen by 60% at room temperature for 10 days. As a result, an area close to the interface of the Si substrate 203 and the $GeSb_2Te_4$ thin film was oxidized and the enhanced electroconductivity region of the $GeSb_2Te_4$ thin film was electrically insulated from the Si substrate 203.

EXAMPLE 2

Now, Example 2 will be described.

While the micro-processing apparatus used in Example 1 was also used for this example, this example differed from Example 1 in that the probe 201, the $GeSb_2Te_4$ thin film 202, the Si substrate 203 and the piezoelectric element 204 were held in vacuum.

A turbo molecular pump was used to produce vacuum. Otherwise, the micro-processing apparatus of this example was same as that of Example 1.

For this example, firstly, the microcomputer 209 specifies the distance separating the tip of the probe 201 and the specimen 210 in terms of the electric current that flows therethrough. Subsequently, a voltage is applied from the power source 205 between the probe 201 and the Si substrate 203 and the current detector 206 detects the electric current flowing between the probe 201 and the Si substrate 203 so that the Z-directional position control circuit 207 controls the piezoelectric element 204 to make the detected electric current equal to the above specified value. While maintaining the feedback control, the XY-directional position control circuit 208 outputs a signal according to the command from the microcomputer 209 in order to drive the piezoelectric element 204 and make the tip of the probe 201 scan the surface of the specimen to be processed 210 in the XY-directions. The surface of the specimen 205 can be observed from the control signal for the XY-directions and the control signal for the Z-direction. Note that this is the normal operation of an STM.

Since the micro-processing apparatus was operated in vacuum for this example, unlike Example 1, the Si substrate 203 was not oxidized at all when a voltage was applied to it for the operation of an STM.

Then, the movement in the XY-directions was suspended when the tip of the probe 201 got to the position on the surface of the specimen 210 to be processed. The microcomputer 209 specified the distance separating the tip of the probe 201 and the specimen 210 in terms of the electric current flowing between them at the time of applying a voltage to raise the electroconductivity. Then, the Z-directional position control circuit 207 operates to make the electric current and hence the distance separating the tip and the specimen 210 equal to the respective specified values.

When the electric current showed the specified value, the Z-directional control circuit 207 stopped operating to stop the movement of the probe in the Z-direction.

Then, the voltage was applied from the power source 205 under this condition to raise the electroconductivity of the $GeSb_2Te_4$ thin film.

In this example, no reduction in the electric current was observed during the period of voltage application for raising the electroconductivity of the $GeSb_2Te_4$ thin film because no oxygen existed around the specimen 210 so that the Si substrate 203 was also free from unnecessary and undesired oxidation.

This example provides an advantage that the distance controlling voltage did not have to rigorously agree with the specified value if compared with Example 1. Additionally, since oxidation was suppressed in this example, the probe could be used for the normal operation of an STM before applying a voltage to raise the electroconductivity of the $GeSb_2Te_4$ thin film so that the positioning in the XY-directions could be conducted accurately.

After the application of the voltage for raising the electroconductivity of the $GeSb_2Te_4$ thin film, only the processed specimen 210 was taken out and an area close to the interface of the Si substrate 203 and the $GeSb_2Te_4$ thin film was oxidized in a manner as described above by referring to Example 1.

In this example again, the enhanced electroconductivity region of the $GeSb_2Te_4$ thin film 202 was electrically insulated from the Si substrate 203.

EXAMPLE 3

Figure 3:
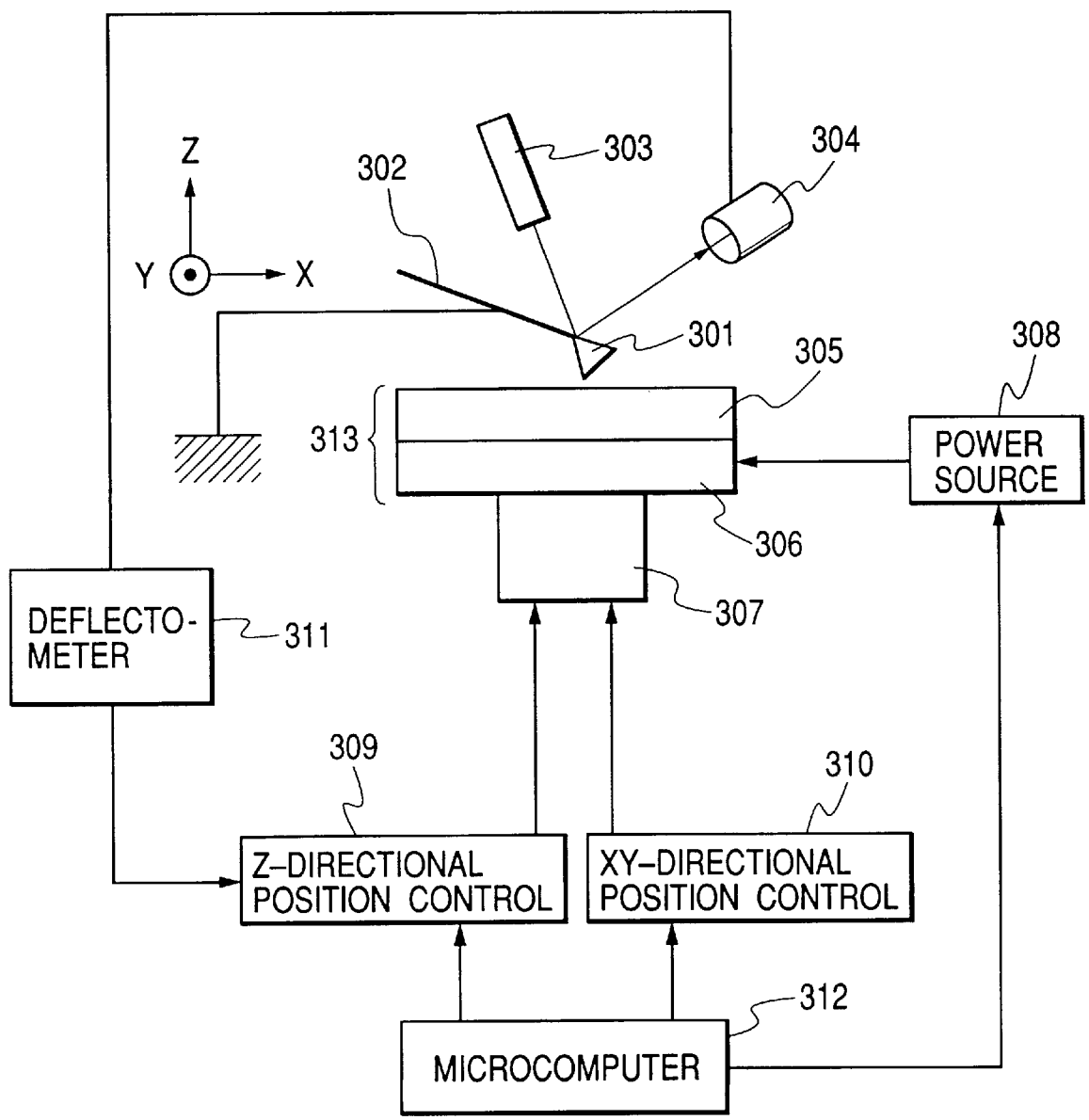
FIG. 3 is a schematic block diagram of another apparatus that can be used with the first mode of carrying out a micro-processing method as illustrated in FIGS. 1A through 1C.

Example 3 will be described by referring to FIG. 3 showing a micro-processing apparatus that can be used with a micro-processing method according to the invention. The shown micro-processing apparatus comprises the following components:

301: a probe,
302: a cantilever,
303: a laser
304: a dichotomic sensor,
307: a piezoelectric element,
308: a power source,
309: a Z-directional position control circuit,
310: an XY-directional position control circuit,
311: a deflectometer
312: a microcomputer.

On the other hand, the specimen to be processed comprises:

305: a polyimide LB film and
306: a Si substrate.

For the purpose of the invention, a specimen to be processed 313 refers to the combination of a polyimide LB film 305 and a Si substrate 306.

The probe 301 is made of Pt and has a sharp tip as in the case of the micro-processing apparatus used in Example 1. The probe 301 is supported by a cantilever 302 in the form of a leaf spring as used in an ordinary AFM. The cantilever 302 of this example has a spring constant of 0.05 N/m.

The laser 303 is used to emit a laser beam that irradiates the side of the cantilever 302 opposite to the side where it faces the specimen to be processed. A semiconductor laser is used in this example. The laser beam emitted from the laser 303 is reflected by the cantilever 302 and strikes the dichotomic sensor 304 that comprises a pair of photodiodes. The laser beam is made to substantially evenly strike the photodiodes, or at a ratio of 1:1.

As the cantilever 302 is flexed, the reflection of the laser beam changes to change the ratio of striking the paired photodiodes of the dichotomic sensor 304. The signal representing the change in the ratio is sent to the flexure detector 311, which then determines the extent of flexure from the input signal.

The extent of flexure represents the force the probe 301 receives from the specimen to be processed 313. This technique of detection is referred to as the optical lever method in ordinary atomic force microscopy.

The polyimide LB film is a polyimide film prepared by means of a Langmuir-Blodgett's technique and changes its electroconductivity when a voltage is applied thereto. The polyimide LB film used in this example had a film thickness of about 5 nm.

The Si substrate 306 is an electroconductive Si(100) having a smooth surface. Any oxide film the Si substrate may have on the surface is removed by means of fluoric acid immediately before a polyimide LB film 305 is deposited thereon.

The piezoelectric element 307 is identical with the one used in Example 1.

The power source 308 is used to apply a voltage between the probe 301 and the Si substrate 306.

The Z-directional position control circuit 309 controls the position of the piezoelectric element 307 in the Z-direction by applying a voltage to the piezoelectric element 307 according to the command from the microcomputer 312. The Z-directional position control circuit 309 can also control the piezoelectric element 307 in the Z-direction so as to make the output value of the deflectometer 311 equal to the value specified by the microcomputer 312.

The XY-directional position control circuit 310 controls the position of the piezoelectric element 307 in the XY-directions by applying a voltage to the piezoelectric element 307 according to the command from the microcomputer 312.

The microcomputer 312 controls the overall operation of micro-processing the specimen 313.

The operation of micro-processing the specimen for this example proceeds in a manner as described below.

The microcomputer 312 specifies the force acting between the tip of the probe 301 and the specimen 313 in terms of the flexure of the cantilever 302.

Subsequently, the Z-directional position control circuit 309 operates to bring the probe 301 into contact with the specimen to be processed 313 according to the command issued from the microcomputer 312 to make the output value of the deflectometer 311 equal to the specified value.

While maintaining the feedback control, the XY-directional position control circuit 310 outputs a signal according to the command from the microcomputer 312 in order to drive the piezoelectric element 307 and make the tip of the probe 301 scan the surface of the specimen to be processed 313 in the XY-directions. The surface of the specimen 313 can be observed from the control signal for the XY-directions and the control signal for the Z-direction.

Note that this is the normal operation of an AFM. The location to be processed on the specimen can be easily specified by observing the surface of the specimen with this normal AFM operation.

The movement in the XY-direction is suspended when the tip of the probe 301 got to the position on the surface of the specimen to be processed by holding the output voltage of the Z-directional position control circuit 309 and that of the XY-directional position control circuit 310 to the piezoelectric element 307.

Then, the power source 308 operates to apply a voltage to raise the electroconductivity of the polyimide LB film according to the command from the microcomputer 312. In this example, a voltage of 7V was applied to produce an area with a diameter of about 5 nm having an enhanced electroconductivity. While the electric current that was flowing during the voltage application was reduced slightly when the probe 301 was made to show negativity, this may be because of anodic oxidation that occurred as the Si substrate 306 was made to show positivity. No such reduction in the electric current was observed when the probe was made to show positivity.

Thus, the probe 301 is preferably made to show positivity in order to raise the electroconductivity in a stable fashion.

Thereafter, only the processed specimen 313 was taken out and exposed to an atmosphere containing oxygen by 40% and nitrogen by 60% at 350° C. for 24 hours.

As a result, an area close to the interface of the Si substrate 306 and the polyimide LB film 305 was oxidized and the enhanced electroconductivity region of the polyimide LB film 305 was electrically insulated from the Si substrate 306.

In this example, an electron confining structure could be formed within an area of a small spot by applying a voltage to raise the electroconductivity only in that area, while rigidly holding the probe 301 to a fixed position and subsequently oxidizing an area close to the interface of the Si substrate 306 and the polyimide LB film 305.

Besides the above technique, it is possible to form a stripe or a relatively extended region as enhanced electroconductivity region by moving the probe 301 in the XY-directions on the surface of the specimen, while applying the voltage between the probe 301 and the specimen and subsequently oxidizing an area close to the interface of the substrate 306 and the polyimide LB film 305 in order to produce a structure for confining electrons in the form of a stripe or a relatively extended region.

With the technique of this example, it is possible to determine the profile of the surface of the specimen without applying a voltage thereto as a cantilever 302 is used to support the probe 301 and the detected flexure of the cantilever 302 is fed back to the position control. As a result, the position to be processed for producing an enhanced electroconductivity region can be located without undesiredly oxidizing the specimen. Additionally, possible damage to the surface of the specimen to be processed by the probe can be minimized due to the fact that polyimide is used for the specimen to be processed.

Finally, the collision of the probe with the specimen to be processed could be effectively suppressed to minimize the damage to the surface of the specimen in this example since a film formed by means of an LB technique and having a very flat surface was used in this example.

EXAMPLE 4

In this example, a micro-processing apparatus as shown in FIG. 3 was used and a polyimide LB film was employed for the specimen to be processed.

The procedure of raising the electroconductivity of the polyimide LB film 305 of Example 3 was also followed in this example.

Subsequently, a voltage of 10V was applied from the power source 308 such that the probe 301 showed negativity while the Si substrate 306 showed positivity.

As a result, an area close to the interface of the Si substrate 306 and the polyimide LB film 305 was oxidized and the enhanced electroconductivity region of the polyimide LB film 305 film was electrically insulated from the Si substrate 306.

This example provided an advantage that no specific oxidation means was required because the probe 301 and the power source 308 used to raise the electroconductivity of the polyimide LB film 305 were also used for the process of oxidizing the substrate.

The example provided an additional advantage that no undesired oxidation occurred because the probe 301 was used for the oxidation and the Si substrate was oxidized only in an area located immediately under the enhanced electroconductivity region of the polyimide LB film.

EXAMPLE 5

Figure 4:
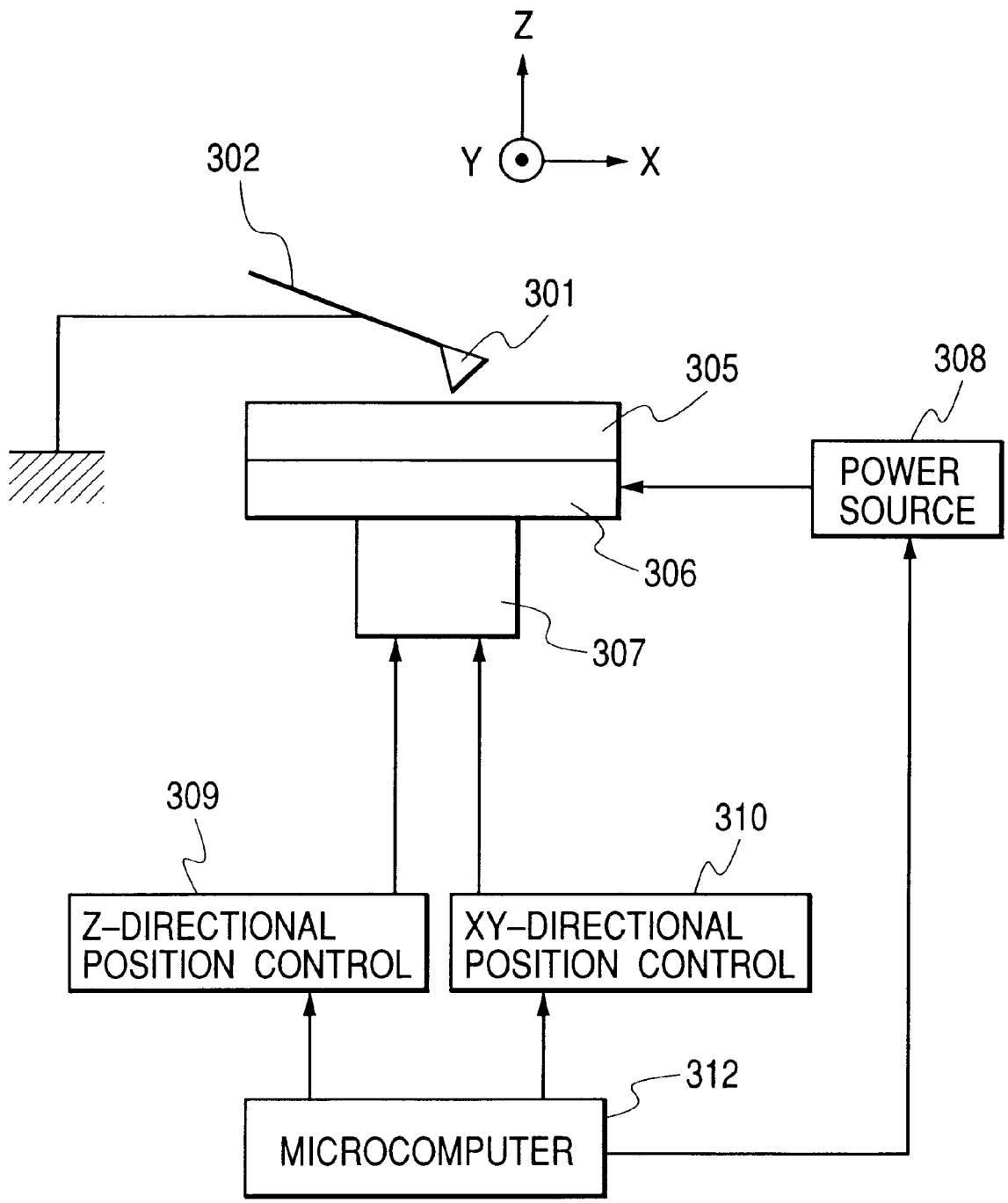
FIG. 4 is a schematic block diagram of still another apparatus that can be used with the first mode of carrying out a micro-processing method as illustrated in FIGS. 1A through 1C.

In this example, a micro-processing apparatus as shown in FIG. 4 was used. The micro-processing apparatus of this example is identical with the apparatus used in Example 3 except that it is devoid of

303: a laser,
304: a dichotomic sensor and
311: a deflectometer which the apparatus of Example 3 comprises.

The Z-directional position control circuit 309 controls the position of the piezoelectric element 307 in the Z-direction by applying a voltage to the piezoelectric element 307 according to the command from the microcomputer 312.

Since the micro-processing apparatus of this example does not comprise a deflectometer, the flexure of the cantilever 302 is not detected in this example.

The spring constant of the cantilever of this example is 0.01 N/m.

Otherwise, the micro-processing apparatus of this example is identical with that of Example 3.

The micro-processing operation of this example will be described below.

Firstly, the microcomputer 312 issues a command to the XY-directional position control circuit 310 to drive the piezoelectric element 307 and move the tip of the probe 301 in the XY-directions to the position where the electroconductivity of the substrate is to be raised.

Then, the microcomputer 312 issues a command to the Z-directional position control circuit 309 to drive the piezoelectric element 307 and move the tip of the probe 301 in the Z-direction to make it contact the surface of the polyimide LB film 305.

While the terminal point of movement in the Z-direction is predetermined, the contact between the probe 301 and the surface of the polyimide LB film is not detected because there is no means provided to detect the flexure of the cantilever 302.

However, as the probe 301 is pressed against the surface of the polyimide LB film, the cantilever 302 is flexed and the probe 301 is placed on the surface of the polyimide LB film. Then, a voltage is applied to the polyimide LB film 305 to raise the electroconductivity thereof in a manner as described above by referring to Example 3.

The subsequent sequence of operation starting from oxidation of an area close to the interface of the Si substrate 306 and the polyimide LB film 305 is same as that of Example 3.

Second Mode of Carrying Out the Invention

Now, a second mode of carrying out a micro-processing method according to the present invention will be described by referring to FIGS. 5A through 5D.

Figure 5A:
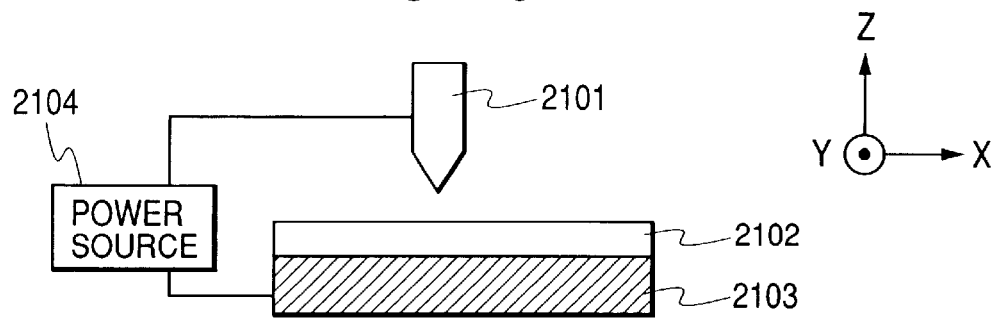
FIGS. 5A, 5B, 5C and 5D are schematic cross sectional lateral views of a system to be used for a second mode of carrying out a micro-processing method according to the invention shown in different machining steps.
Figure 5B:
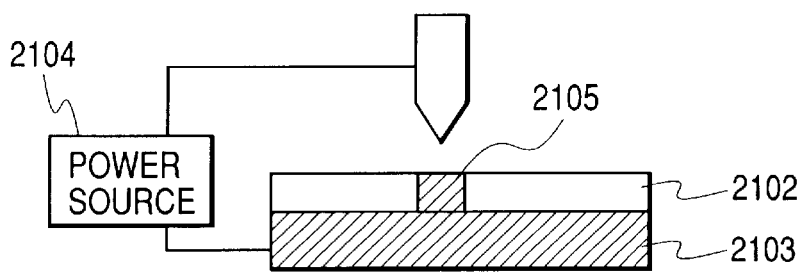

Firstly, the tip of probe 2101 is placed on or near the surface to be processed of the non-electroconductive thin film 2102 (FIG. 5A).

The expression "near the surface" as used herein refers to a position where the voltage applied between the probe and the non-electroconductive thin film can affect the latter.

This means that the voltage applied to the non-electroconductive thin film can modify the electroconductivity of the non-electroconductive thin film or the applied voltage gives rise to an electric current that can modify the electroconductivity of the non-electroconductive thin film.

Then, a voltage is applied between the probe 2101 and the electroconductive substrate 2103 by means of an external power source 2104.

As a result of the voltage application, a voltage is applied to the non-electroconductive thin film in a direction perpendicular relative to the substrate to raise the electroconductivity of the non-electroconductive thin film in a specific area (FIG. 5B), which area is referred to as enhanced electroconductivity region 2105. Under this condition, the enhanced electroconductivity region is electrically connected to the electroconductive substrate 2103.

Figure 5C:
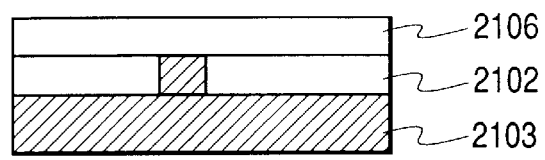

Thereafter, a non-electroconductive substrate 2106 is bonded to the surface of the non-electroconductive thin film 2102 that includes the enhanced electroconductivity region (FIG. 5C). The term "non-electroconductive" as used herein refers to the property of presenting an energy barrier relative to the enhanced electroconductivity region produced by the voltage application.

Such an energy barrier may be present relative to the energy level of the electrons located in the enhanced electroconductivity region or, alternatively, it may be present relative to the energy level of the holes located in the enhanced electroconductivity region. If the enhanced electroconductivity region shows metallic properties, the use of a semiconductor material having an electron affinity lower than its work function for the substrate 2106 will provide an effective energy barrier arranged on the interface with the substrate 2106 against the electrons in the enhanced electroconductivity region.

Figure 5D:
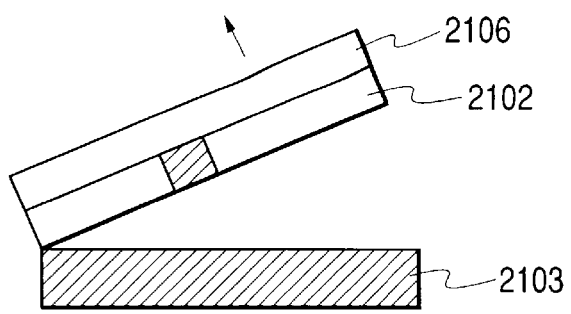

Then, under this condition, the non-electroconductive substrate 2106 is peeled off with the non-electroconductive thin film 2102 bonded thereto (FIG. 5D).

Note that the enhanced electroconductivity region 2105 of the non-electroconductive thin film 2102 is also peeled off at this time. As a result, the non-electroconductive thin film 2102 is transferred to the non-electroconductive substrate 2106.

Thus, the enhanced electroconductivity region 2105 is a micro-area electrically insulated from the outside because of the insulating effect of the substrate 2106.

While the entire substrate 2106 is made of a non-electroconductive material in FIGS. 5A through 5D, only the surface that is held in contact with the non-electroconductive thin film 2102 may alternatively be made non-electroconductive.

Still alternatively, only an area of the surface located under the enhanced electroconductivity region 2105 of the substrate 2106 may be made non-electroconductive.

While any material whose electroconductivity is raised when a voltage is applied thereto may be used for the non-electroconductive thin film 2102, the use of polyimide is preferable because it shows a high mechanical strength and can remain mechanically undamaged if the probe collides with the non-electroconductive thin film for some reason or other.

Note that the use of a non-electroconductive thin film prepared by means of a Langmuir-Blodgett's technique is particularly advantageous because it has a very flat surface and hence can minimize the risk of the probe colliding with the surface of the film and the positional dependency of the voltage application.

A probe that can be used for SPM can also be used for the purpose of the invention so long as it is electroconductive.

A probe that can be used for the purpose of the invention can also be operated for SPM. For example, by applying a voltage between such a probe and an electroconductive substrate to such an extent that it does not raise the electroconductivity of the non-electroconductive thin film disposed therebetween and by controlling the probe to move in the Z-direction as shown in FIG. 5A so that the electric current flowing there may be held to a constant level, while driving the probe to scan in the X- and Y-directions in FIG. 5A, data on the surface of the non-electroconductive thin film 2102 can be obtained from the control signal for controlling the probe in the Z-direction. This is exactly the theory for observing the surface of a micro-object by means of an STM.

If the probe is supported by a resilient member in such a way that the tip of the probe is just in contact with the surface of the non-electroconductive thin film and a voltage is applied thereto under this condition, then an accident where the probe digs into the non-electroconductive thin film to damage the latter can be effectively avoided. For the purpose of the invention, the resilient member may be a leaf spring of the type typically used as a cantilever in an ordinary AFM.

The use of a resilient member is advantageous in that, if the resilient member is moved to make the tip of the probe to be pressed against the surface of the non-electroconductive thin film from the state where the tip is just in contact with the surface of the thin film, the resilient member can effectively absorb the energy of the pressure by the flexure.

The probe can be used for an ordinary AFM which is provided with an arrangement for detecting the flexure of the probe. Thus, by designing the probe to operate as that of an ordinary AFM, the surface of the non-electroconductive thin film can be observed without applying a voltage thereto prior to the operation of raising the electroconductivity of the thin film by applying a voltage thereto. Then, the non-electroconductive thin film can be held free from any unnecessary and undesired voltage application.

Now, the second mode of carrying out the present invention will be described by way of examples.

EXAMPLE 6

Figure 6:
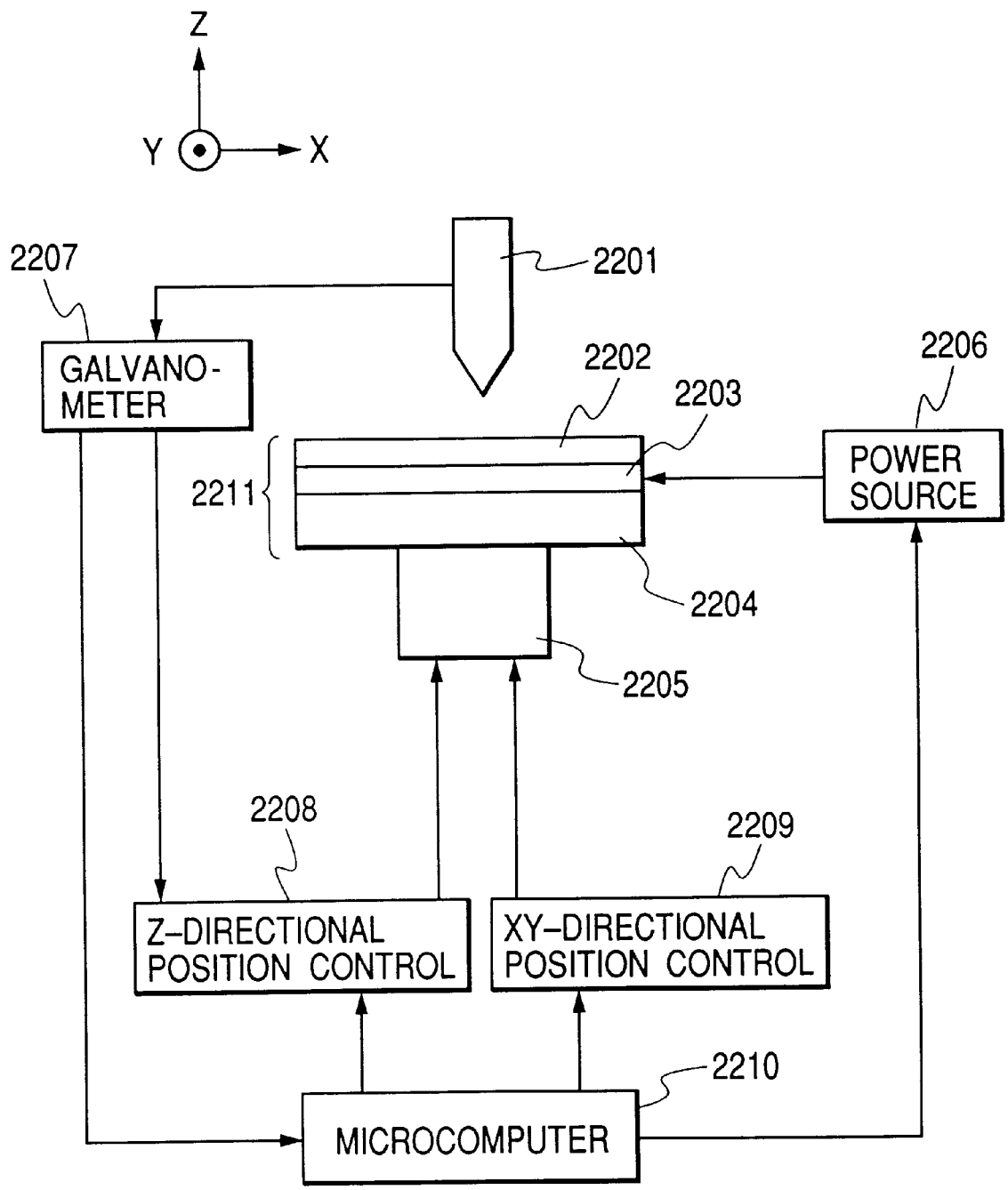
FIG. 6 is a schematic block diagram of an apparatus that can be used with the second mode of carrying out a micro-processing method as illustrated in FIGS. 5A through 5D.

Example 6 will be described by referring to FIG. 6 showing a micro-processing apparatus that can be used with a micro-processing method according to the invention. The shown micro-processing apparatus comprises the following components:

2201: a probe,
2205: a piezoelectric element,
2206: a power source,
2207: a current detector,
2208: a Z-directional position control circuit,
2209: an XY-directional position control circuit and
2210: a microcomputer.

On the other hand, the specimen to be processed comprises:

2202: a polyimide LB film,
2203: a Au thin film and
2204: a piece of mica.

The Au thin film 2203 is obtained through an epitaxial growth process conducted on the mica 2204.

The polyimide LB film 2202 is formed by means of a Langmuir-Blodgett's (LB) technique and has a film thickness of 3 nm. The electroconductivity of the polyimide LB film 2202 is raised when a voltage is applied thereto.

The polyimide LB film 2202, the Au thin film 2203 and the piece of mica 2204 as combined together is referred to as specimen to be processed 2211.

The probe 2201 is made of Pt and available as component of an ordinary STM. Its tip shows a radius of curvature on the order of 10 nm.

The piezoelectric element 2205 is available as component of an ordinary STM and is used to support thereon a specimen to be processed 2211.

The specimen can be moved in each of the X-, Y- and Z-directions by externally applying a voltage to the piezoelectric element.

The location of the probe 2201 and that of the specimen to be processed 2211 relative to each other can be thus controlled by the piezoelectric element.

The power source 2206 is used to apply a voltage between the probe 2201 and the Au thin film 2203.

The current detector 2207 detects the electric current flowing between the probe 2201 and the Au thin film 2203 and sends a signal representing the detected current to the Z-directional position control circuit 2208 and the microcomputer 2210.

The Z-directional position control circuit 2208 controls the position of the piezoelectric element 2205 in the Z-direction by applying a voltage to the piezoelectric element 2205 according to the command from the microcomputer 2210.

The Z-directional position control circuit 2208 can also control the piezoelectric element 2205 in the Z-direction so as to make the electric current detected by the current detector 2207 equal to the electric current specified by the microcomputer 2210.

The XY-directional position control circuit 2209 controls the position of the piezoelectric element 2205 in the XY-directions by applying a voltage to the piezoelectric element 2205 according to the command from the microcomputer 2210.

The microcomputer 2210 controls the overall operation of micro-processing the specimen 2211.

The operation of micro-processing the specimen for this example proceeds in a manner as described below.

First, the XY-directional position control circuit 2209 outputs a signal according to the command from the microcomputer 2210 in order to drive the piezoelectric element 2205 and bring the tip of the probe 2201 to the position on the surface of the specimen 2211 to be processed.

Then, the microcomputer 2210 specifies the distance separating the tip of the probe 2201 and the specimen 2211 in terms of the electric current that flows therethrough.

Subsequently, a voltage is applied from the power source 2206 between the probe 2201 and the Au thin film 2203 and the current detector 2207 detects the electric current flowing between the probe 2201 and the Au thin film 2203 so that the Z-directional position control circuit 2208 controls the piezoelectric element 2205 to make the detected electric current equal to the above specified value.

Note that the applied voltage is referred to as "the distance controlling voltage". The Z-directional position control circuit 2208 stops operating when the electric current gets to the specified value. Then, a voltage for raising the electroconductivity of the polyimide LB film is applied from the power source 2206. This voltage is referred to as "the electroconductivity raising voltage". Generally, a value that does not raise the electroconductivity of the polyimide LB film 2202 is selected for the distance controlling voltage and a value that can sufficiently raise the electroconductivity of the polyimide LB film 2202 is selected for the electroconductivity raising voltage.

In this example, 0.4V was used for the distance controlling voltage whereas 4.0V was used for the electroconductivity raising voltage.

In this example, an area with a diameter of about 5 nm having an enhanced electroconductivity was formed in the polyimide LB film 2202 by applying the above electroconductivity raising voltage.

Figure 7A:
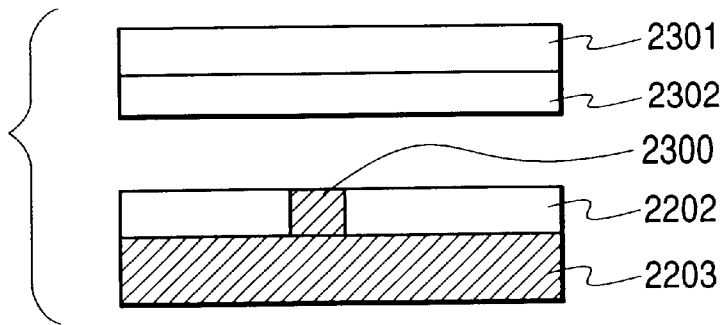
FIGS. 7A, 7B and 7C are schematic cross sectional lateral views of the system of FIGS. 5A through 5D, showing a specific peeling technique in different steps.
Figure 7B:
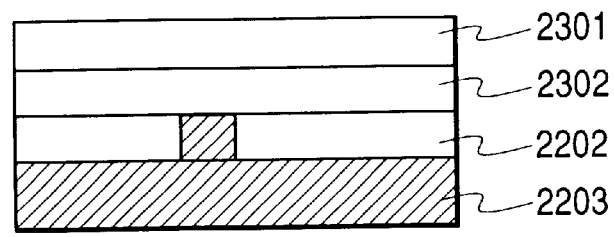
Figure 7C:
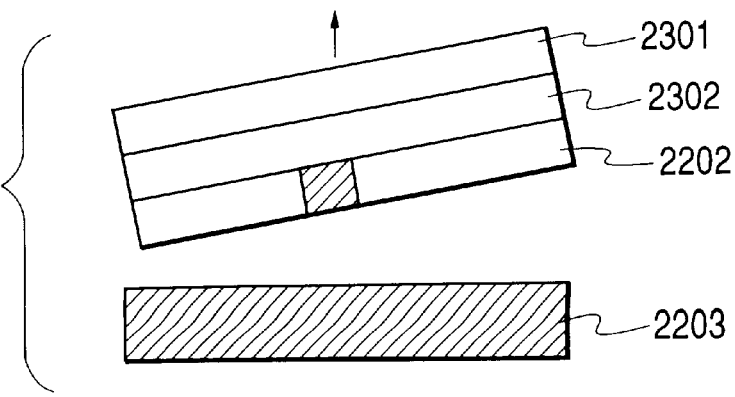

Subsequently, the polyimide LB film is peeled off and transferred in a manner as illustrated in FIGS. 7A through 7C.

In FIGS. 7A through 7C, there are shown
2300: an enhanced electroconductivity region,
2301: an Si substrate and
2302: an epoxy resin layer.

The enhanced electroconductivity region 2300 shows a raised electroconductivity as a result of voltage application. The epoxy resin layer 2302 is formed by applying epoxy resin to the Si substrate 2301. It is set when dried after it has been applied and operates as adhesive.

In this example, epoxy resin 2302 is firstly applied to the Si substrate 2301 (FIG. 7A).

Then, the surface of the applied epoxy resin 2302 is brought to contact with the corresponding surface of the polyimide LB film 2202 before the epoxy resin 2302 is set and then the epoxy resin 2302 is allowed to set (FIG. 7B).

Thereafter, the Si substrate 2301 is peeled off from the processed specimen 2211. Since the epoxy resin has already been set at this time, the Si substrate 2301, the epoxy resin layer 2302 and the polyimide LB film 2202 are peeled off from the Au thin film 2203 (FIG. 7C).

Since epoxy resin is electrically insulating, electrons are confined within the enhanced electroconductivity region 2300 to give rise to quantum effects.

In this example, an electron confining structure could be formed within an area of a small spot by applying a voltage to raise the electroconductivity only in that area, while rigidly holding the probe 2201 to a fixed position and subsequently transferring the polyimide LB film including the enhanced electroconductivity region.

Besides the above technique, it is possible to form a stripe or a relatively extended region as enhanced electroconductivity region by moving the probe 2201 in the XY-directions on the surface of the specimen, while applying the voltage between the probe 2201 and the specimen and subsequently transferring the polyimide LB film including the enhanced electroconductivity region in order to produce a structure for confining electrons in the form of a stripe or a relatively extended region.

In this example, possible damage to the surface of the specimen to be processed by the probe can be minimized due to the fact that polyimide is used for the specimen to be processed. Additionally, the collision of the probe with the specimen to be processed could be effectively suppressed to minimize the damage to the surface of the specimen in this example since a film formed by means of an LB technique and having a very flat surface was used in this example.

EXAMPLE 7

Example 7 will be described by referring to FIG. 8 showing a micro-processing apparatus that can be used with a micro-processing method according to the invention. The shown micro-processing apparatus comprises the following components:
2401: a probe,
2402: a cantilever,
2403: a laser,
2404: a dichotomic sensor,
2408: a piezoelectric element,
2409: a power source,
2410: a Z-directional position control circuit,
2411: an XY-directional position control circuit,
2412: a deflectometer and
2413: a microcomputer.

On the other hand, the specimen to be processed comprises:
2405: a polyimide LB film,
2406: a Au thin film and
2407: a piece of mica.

The polyimide LB film 2405, the Au thin film 2406 and the piece of mica 2407 of this example are identical respectively with the polyimide LB film 2202, the Au thin film 2203 and the piece of mica 2204 in Example 6. For this example, a specimen to be processed 2414 refers to the combination of a polyimide LB film 2405, a Au thin film 2406 and a piece of mica 2407.

The probe 2401 is made of Pt and has a sharp tip as in the case of the micro-processing apparatus used in Example 6. The probe 2401 is supported by a cantilever 2402 in the form of a leaf spring as used in an ordinary AFM. The cantilever 2402 of this example had a spring constant of 0.05 N/m.

The laser 2403 is used to emit a laser beam that irradiates the side of the cantilever 2402 opposite to the side where it faces the specimen to be processed. A semiconductor laser was used in this example. The laser beam emitted from the laser 2403 is reflected by the cantilever 2402 and strikes the dichotomic sensor 2404 that comprises a pair of photodiodes. The laser beam is made to substantially evenly strike the photodiodes, or at a ratio of 1:1.

As the cantilever 2402 is flexed, the reflection of the laser beam changes to change the ratio of striking the paired photodiodes of the dichotomic sensor 2404. The signal representing the change in the ratio is sent to the flexure detector 2412, which then determines the extent of flexure from the input signal.

The extent of flexure represents the force the probe 2401 receives from the specimen to be processed 2414. This technique of detection is referred to as the optical lever method in ordinary atomic force microscopy.

The polyimide LB film is a polyimide film prepared by means of a Langmuir-Blodgett's technique and changes its electroconductivity when a voltage is applied thereto.

The piezoelectric element 2408 is identical with the one used in Example 6.

The power source 2409 is used to apply a voltage between the probe 2401 and the Au thin film 2406.

The Z-directional position control circuit 2410 controls the position of the piezoelectric element 2408 in the Z-direction by applying a voltage to the piezoelectric element 2408 according to the command from the microcomputer 2413. The Z-directional position control circuit 2410 can also control the piezoelectric element 2408 in the Z-direction so as to make the output value of the deflectometer 2412 equal to the value specified by the microcomputer 2413.

The XY-directional position control circuit 2411 controls the position of the piezoelectric element 2408 in the XY-directions by applying a voltage to the piezoelectric element 2408 according to the command from the microcomputer 2413.

The microcomputer 2413 controls the overall operation of micro-processing the specimen 2414.

The operation of micro-processing the specimen for this example proceeds in a manner as described below.

The microcomputer 2413 specifies the force acting between the tip of the probe 2401 and the specimen 2414 in terms of the flexure of the cantilever 2402.

Subsequently, the Z-directional position control circuit 2410 operates to bring the probe 2401 into contact with the specimen to be processed 2414 according to the command issued from the microcomputer 2413 to make the output value of the deflectometer 2412 equal to the specified value.

While maintaining the feedback control, the XY-directional position control circuit 2411 outputs a signal according to the command from the microcomputer 2413 in order to drive the piezoelectric element 2408 and make the tip of the probe 2401 scan the surface of the specimen to be processed 2414 in the XY-directions.

The surface of the specimen 2414 can be observed from the control signal for the XY-directions and the control signal for the Z-direction.

Note that this is the normal operation of an AFM. The location to be processed on the specimen can be easily specified by observing the surface of the specimen with this normal AFM operation.

The movement in the XY-direction is suspended when the tip of the probe 2401 got to the position on the surface of the specimen to be processed by holding the output voltage of the Z-directional position control circuit 2410 and that of the XY-directional position control circuit 2411 to the piezoelectric element 2408. Then, the power source 2409 operates to apply a voltage to raise the electroconductivity of the polyimide LB film according to the command from the microcomputer 2413.

In this example, a voltage of 7V was applied to produce an area with a diameter of about 10 nm having an enhanced electroconductivity. Then, the polyimide LB film 2405 is transferred onto the epoxy resin layer in a manner as described by referring to Example 6.

Note that the following correspondences hold true between Example 6 and Example 7.

| Example 6 | Example 7 |
|---|---|
| polyimide LB film 2202 | polyimide LB film 2405 |
| Au thin film 2203 | Au thin film 2406 |
| mica 2204 | mica 2407 |
| processed specimen 2211 | processed specimen 2414 |

In this example again, possible damage to the surface of the specimen to be processed by the probe can be minimized due to the fact that polyimide is used for the specimen to be processed. Additionally, the collision of the probe with the specimen to be processed could be effectively suppressed to minimize the damage to the surface of the specimen in this example since a film formed by means of an LB technique and having a very flat surface was used in this example.

EXAMPLE 8

Figure 9:
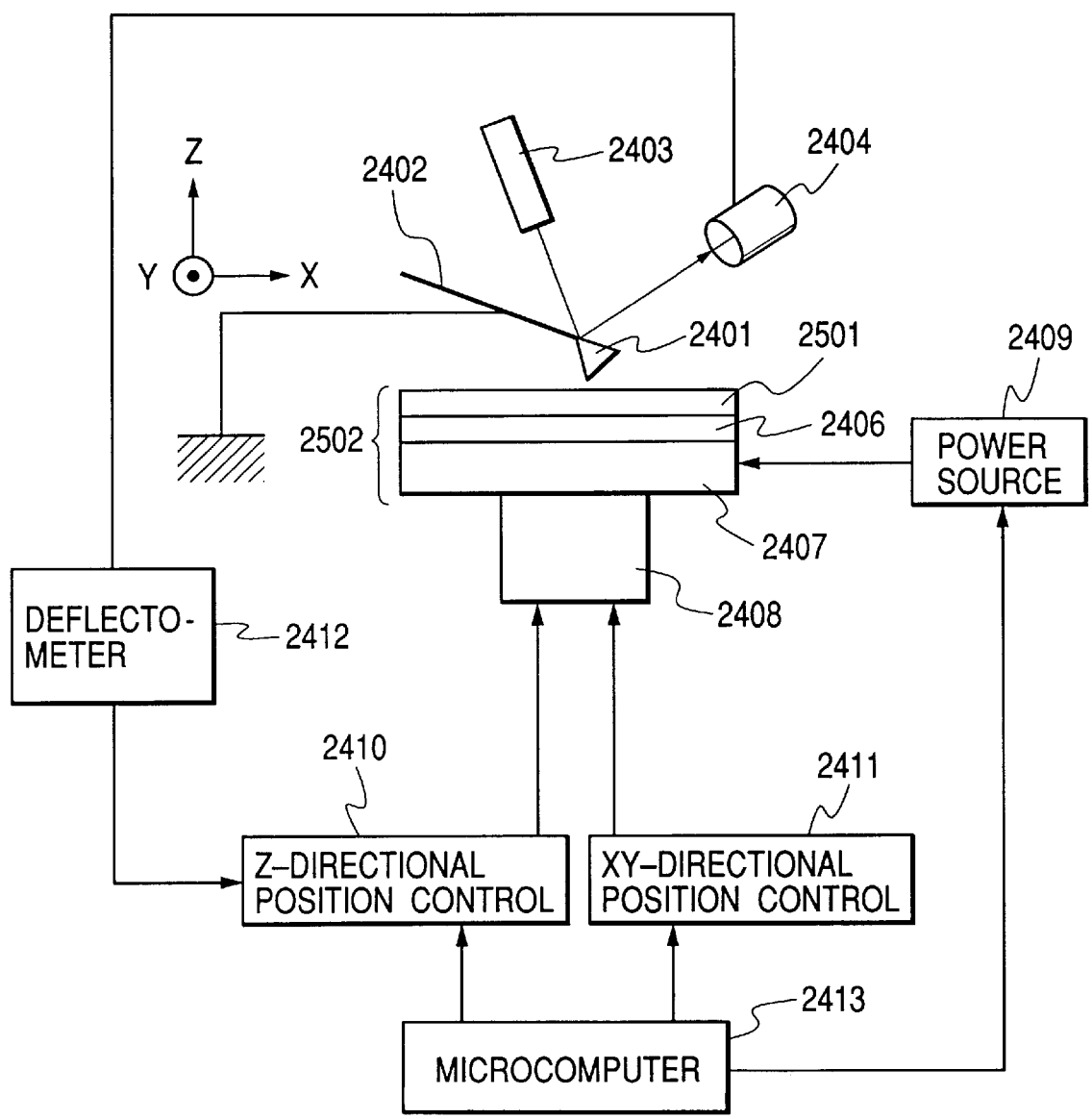
FIG. 9 is a schematic block diagram of still another apparatus that can be used with the second mode of carrying out a micro-machining method as illustrated in FIGS. 5A through 5D.

Example 8 will be described by referring to FIG. 9 showing an micro-processing apparatus that can be used with a micro-processing method according to the invention.

A $GeSb_2Te_4$ film is micro-processed in this example. This example differs from Example 7 only in that the polyimide LB film of Example 7 is replaced by the $GeSb_2Te_4$ film in this example.

The $GeSb_2Te_4$ film 2501 is formed on a Au thin film 2406 by sputtering and its electroconductivity is raised when a voltage is applied thereto.

For this example, a specimen to be processed 2502 refers to the combination of a $GeSb_2Te_4$ film 2501, a Au thin film 2406 and a piece of mica 2407.

The micro-processing apparatus of this example is identical with that of Example 7 except that the specimen to be processed 2502 is different.

Firstly, the tip of the probe 2401 is brought to the position on the surface of the $GeSb_2Te_4$ film 2501 to be processed in a manner as described above by referring to Example 7. Then, the power source 2409 operates to apply a voltage to raise the electroconductivity of the $GeSb_2Te_4$ film 2501 according to the command from the microcomputer 2413.

In this example, an area with a diameter of about 20 nm having an enhanced electroconductivity was formed in the $GeSb_2Te_4$ film 2501 by applying a voltage of 10V.

Then, the processed specimen 2502 is taken out from the micro-processing apparatus and the steps shown in FIGS. 10A through 10D are followed.

Firstly, a $SiO_2$ film 2601 is formed on the taken out specimen 2502 by sputtering and then a Au/Cr film 2602 is laid thereon also by sputtering (FIGS. 10A and 10B).

Note that the $GeSb_2Te_4$ film 2501 of the taken out specimen 2502 includes an enhanced electroconductivity region 2600, which is produced by applying a voltage.

Subsequently, the specimen 2502 is heat-treated with the Si substrate 2603 held in contact with it (FIG. 10C) to produce an eutectic state of the Au/Cr film 2602 and the Si substrate 2603.

Thereafter, the Si substrate 2603, the Au/Cr film 2602, the $SiO_2$ film 2601 and the $GeSb_2Te_4$ film 2501 are peeled off (FIG. 10D).

The enhanced electroconductivity region 2600 contained in the $GeSb_2Te_4$ film 2501 is electrically insulated from the Si substrate 2603 and the Au/Cr film 2602 by means of the $SiO_2$ film 2601 to give rise to a state where electrons are confined in that area.

What is claimed is:

1. A micro-processing method of forming a structure adapted to confine electrons within a micro-region, said method comprising steps of:

arranging a probe oppositely relative to a non-electroconductive thin film arranged on an electroconductive substrate;

placing said probe on or near the surface to be processed of said non-electroconductive thin film;

applying a voltage between said probe and said substrate to form an enhanced electroconductivity region as compared with the remaining area in said non-electroconductive thin film; and oxidizing the interface of said substrate and said non-electroconductive thin film.

2. A method according to claim 1, wherein said voltage application is conducted in vacuum.

3. A method according to claim 1, wherein said probe is made to show positivity for said voltage application.

4. A method according to claim 1, wherein said oxidation is anionic oxidation.

5. A method according to claim 1, wherein said oxidation is performed by heating.

6. A method according to claim 1, wherein said non-electroconductive thin film is made of polyimide.

7. A method according to claim 1, wherein said non-electroconductive thin film is formed by means of a Langmuir-Blodgett's technique.

8. A method according to claim 1, wherein said probe is supported by a resilient member and said voltage is applied while the tip of said probe and said non-electroconductive thin film are held in contact with each other.

9. A micro-processing method of forming a structure adapted to confine electrons within a micro-region, said method comprising steps of:

arranging a probe oppositely relative to a non-electroconductive thin film arranged on an electroconductive substrate;

placing said probe on or near the surface to be processed of said non-electroconductive thin film;

applying a voltage between said probe and said substrate to form an enhanced electroconductivity region as compared with the remaining area in said non-electroconductive thin film; and causing at least part of said enhanced electroconductivity region to contact with a non-electroconductive area constituting at least part of another substrate and transferring said non-electroconductive thin film onto said another substrate.

10. A method according to claim 9, wherein said voltage application is conducted in vacuum.

11. A method according to claim 9, wherein said probe is made to show positivity for said voltage application.

12. A method according to claim 9, wherein said non-electroconductive thin film is made of polyimide.

13. A method according to claim 9, wherein said non-electroconductive thin film is formed by means of a Langmuir-Blodgett's technique.

14. A method according to claim 9, wherein said probe is supported by a resilient member and said voltage is applied while the tip of said probe and said non-electroconductive thin film are held in contact with each other.

* * * * *